(12) United States Patent
Goetting et al.

(10) Patent No.: US 6,204,710 B1
(45) Date of Patent: *Mar. 20, 2001

(54) PRECISION TRIM CIRCUIT FOR DELAY LINES

(75) Inventors: F. Erich Goetting, Cupertino; Paul G. Hyland, Saratoga; Joseph H. Hassoun, Los Gatos, all of CA (US)

(73) Assignee: Xilinx, Inc., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/102,730

(22) Filed: Jun. 22, 1998

(51) Int. Cl.$^7$ .................................................. H03K 5/13
(52) U.S. Cl. ............................................ 327/276; 327/277
(58) Field of Search .................................. 327/262, 263, 327/269, 270, 271, 276, 277, 278, 281

(56) References Cited

U.S. PATENT DOCUMENTS

| 5,210,450 | * | 5/1993 | Parkinson | 327/269 |
| 5,465,076 | * | 11/1995 | Yamauchi et al. | 331/179 |
| 5,719,514 | * | 2/1998 | Sato | 327/262 |
| 5,781,056 | * | 7/1998 | Fujii | 327/276 |
| 5,949,269 | * | 9/1999 | Allen | 327/285 |

FOREIGN PATENT DOCUMENTS

| 621689 | * | 10/1994 | (EP) | 327/276 |
| 5-191233 | * | 7/1993 | (JP) | 327/261 |

* cited by examiner

Primary Examiner—Tuan T. Lam
(74) Attorney, Agent, or Firm—Edward S. Mao, Esq.; Bever, Hoffman & Harms; Lois D. Cartier

(57) ABSTRACT

A precision trim circuit for a tuneable delay line is provided. The precision trim circuit provides delays greater than the base delay of the tuneable delay line. By using larger delays than conventional trim circuits, the precision trim circuit of the present invention can use components that react to process and environmental variations in the same manner as the components of the tuneable delay line. Specifically, one embodiment of the precision trim circuit comprises a first delay element providing a delay greater than or equal to the base delay of the tuneable delay line. The precision trim circuit also comprises a second delay element providing a greater delay than the first delay element. A multiplexer coupled to the first delay element and the second delay element is used to select the amount of delay provided by the precision trim circuit. Other embodiments include additional delay elements providing varying delay values.

13 Claims, 11 Drawing Sheets

PRECISION TRIM CIRCUIT FOR DELAY LINES

FIELD OF THE INVENTION

The present invention relates to trim circuits for delay lines. More specifically, the invention relates to a trim circuit that responds to environmental and process variations in a manner similar to an associated delay line.

BACKGROUND OF THE INVENTION

Delay lines are used in digital circuits such as board-level systems and integrated circuit (IC) devices, including field programmable gate arrays (FPGAS) and microprocessors, to control the timing of various signals in the digital circuits. A simple delay line receives an input signal on an input terminal and provides an output signal on an output terminal that is a copy of the input signal delayed by a certain time period (referred to as the delay D of the delay line). More complicated delay lines are tuneable so that delay D of the delay line can be adjusted.

An IC device such as an FPGA can use a tuneable delay line to synchronize clock signals in various parts of the FPGA. As shown in FIG. 1, an FPGA 100 comprises a delay line 110, configurable logic circuits 120, and configurable logic circuits 130. Clock signal CLK1 is provided to an input terminal of delay line 110 and to the clocked circuits (not shown) of configurable logic circuits 120. Delay line 110 drives a clock signal CLK2 to configurable logic circuits 130. Before clock signal CLK2 reaches configurable logic circuits 130, clock signal CLK2 may be skewed by various factors such as capacitance, heavy loading on the clock line, and propagation delay. The various skewing factors are represented by clock skew 140, which causes a skew delay S_D (not shown) on clock signal CLK2. To distinguish clock signal CLK2 from the skewed version of clock signal CLK2, the skewed version is referred to as skewed clock signal S_CLK2. Skewed clock signal S_CLK2 drives the clock input terminals (not shown) of the clocked circuits within configurable logic circuits 130. For proper operation of FPGA 100, skewed clock signal S_CLK2 should be synchronized with clock signal CLK1. Skewed clock signal S_CLK2 can be synchronized with clock signal CLK1 by adjusting delay line 110 so that delay D plus skew delay S_D is equal to a multiple of the period of clock signal CLK1. Various circuits and methods of using delay lines to synchronize clock signals are well known in the art.

FIG. 2 shows a block diagram of a conventional tuneable delay line 200. Tuneable delay line 200 comprises a plurality of delay elements 210_1 to 210_N and a multiplexer 220. Delay elements 210_1 to 210_N are coupled in series so that the input terminal of a delay element 210_X is coupled to the output terminal of a delay element 210_X-1, where X is an integer from 2 to N. The input terminal of delay element 210_1 is coupled to input terminal IN of tuneable delay line 200. Each delay element 210_X drives a delayed output signal D_O[X]. Delayed output signal D_O[0] is provided by the input terminal of delay element 210_1. Each delay element is identical and provides a delay equal to base delay B_D. Thus, each delayed output signal D_O[X] is delayed by base delay B_D from the previous delayed output signal D_O[X-1].

Therefore, each delayed output signal is a copy of input signal IN delayed by some multiple of basic delay B_D of tuneable delay line 200. Specifically, delayed output signal D_O[0] is a copy of input signal IN delayed by zero times basic delay B_D, (i.e. not delayed). Delayed output signal D_O[1] is a copy of input signal IN delayed by basic delay B_D. Delay output signal D_O[2] is a copy of input signal IN delayed by two times basic delay B_D. In general, delayed output signal D_O[X] is a copy of input signal IN delayed by X times the basic delay B_D.

Multiplexer 220 receives some or all of the delayed output signals. Thus, the input terminals of multiplexer 220 are coupled to the delay elements. Multiplexer 220 is controlled by delay select signals DS[0–M]. To avoid confusion, terminals are referred to with the same identifier as the signals driven by the terminal. For example, delayed output signal D_O[2] is driven by output terminal D_O[2]. As used herein, signals that logically form groups are referred to using brackets and a number for each signal. If more than one signal is referred to simultaneously, brackets containing a range of numbers are used. For example, delay select signals DS[0–M] comprise M+1 signals that are referred to as DS[0], DS[1], . . . DS[M]. Delay select lines DS[0–M] select which delayed output signal multiplexer 220 drives on output terminal OUT.

Thus, the precision of typical delay lines is base delay B_D. To increase the precision of a delay line, base delay B_D can be decreased. However, with a smaller base delay the delay line must include many more delay elements to be able to provide large delays, which increases the cost of the delay line. Another method to increase the precision of a delay line is to use a trim circuit 310 (FIG. 3) with tuneable delay line 200. Specifically, output signal OUT of tuneable delay line 200 is coupled to the input terminal T_IN of trim circuit 310. Trim circuit 310 drives a trim output signal T_OUT that is delayed by a trim delay T_D, which is a fraction of base delay B_D. The amount of trim delay T_D is controlled by trim select signals TS[0–P].

FIG. 4 is a block diagram of a conventional trim circuit 310 comprising delay elements 410, 420, 430 and a multiplexer 450. Delay elements 410, 420, and 430 receive trim input signal T_IN and generate trim delayed output signals TDO[1], TDO[2], and TDO[3], respectively. Multiplexer 450 receives trim input signal T_IN and trim delayed output signals TDO[1–3]. Multiplexer 450 provides one of the trim delayed output signals TDO[1–3] or trim input signal T_IN as trim output signal T_OUT, in response to trim select signals TS[0–1]. Delay element 410 provides a trim delay equal to one-fourth times base delay B_D. Delay element 420 provides a trim delay equal to one-half times base delay B_D. Delay element 430 provides a trim delay equal to three-fourths times base delay B_D. Thus, trim circuit 310 can be configured to provide a trim delay of 0, ¼, ½, or ¾ times base delay B_D. Therefore, the combination of tuneable delay line 200 and the example trim circuit 310 in FIG. 4 has an effective precision of ¼ times base delay B_D.

To create delays smaller than base delay B_D, the delay elements in trim circuits (e.g., delay elements 410, 420, 430) typically use components that are significantly smaller and faster than the components used in the delay elements of tuneable delay line 200. However, the speeds of the smaller components are more greatly affected by process variations and environmental conditions than the speeds of the larger components. Thus, the accuracy of conventional trim circuits varies due to process variations and environmental conditions. Therefore, there is a need for a trim circuit for a tuneable delay line that reacts to process variations and varying environmental conditions in a manner similar to the tuneable delay line.

SUMMARY OF THE INVENTION

The invention provides a trim circuit that generates trim delays equal to or greater than the base delay of the tuneable delay line. Thus, the trim circuit and the tuneable delay line can be formed using components of similar sizes. Consequently, the precision trim circuit reacts to process variations and environmental conditions in a manner similar to the tuneable delay line.

In some embodiments of the present invention, a trim circuit comprises a first delay element having a delay greater than or equal to the base delay of the tuneable delay line. The trim circuit also comprises a second delay element having a delay greater than the delay of the first delay element. A multiplexer circuit is coupled to both the first delay element and the second delay element to select the amount of trim delay provided by the trim circuit. In one embodiment, the first delay element has a delay approximately equal to the base delay of the tuneable delay line and the second delay element has a delay approximately equal to 1.5 times the base delay of the tuneable delay line.

In other embodiments, the trim circuit also comprises third and fourth delay elements. The third delay element has a delay greater than the delay of the second delay element. The fourth delay element has a delay greater than the delay of the third delay element. In one embodiment, the first delay element has a delay approximately equal to the base delay of the tuneable delay line. The second delay element has a delay approximately equal to 5/4 times the base delay of the tuneable delay line. The third delay element has a delay equal to 3/2 times the base delay of the tuneable delay line; and the fourth delay element has a delay equal to 7/4 times the base delay of the tuneable delay line.

The delay elements of some embodiments of the present invention comprise two inverters coupled in series. The delay provided by one of these delay elements is equal to the sum of the propagation delay of the two inverters. Different delay elements are designed to have different delays by modifying the propagation delays of the inverters. The delay elements can also be formed using RC circuits.

The present invention will be more fully understood in view of the following description and drawings.

DETAILED DESCRIPTION OF THE DRAWINGS

Figure 5A:
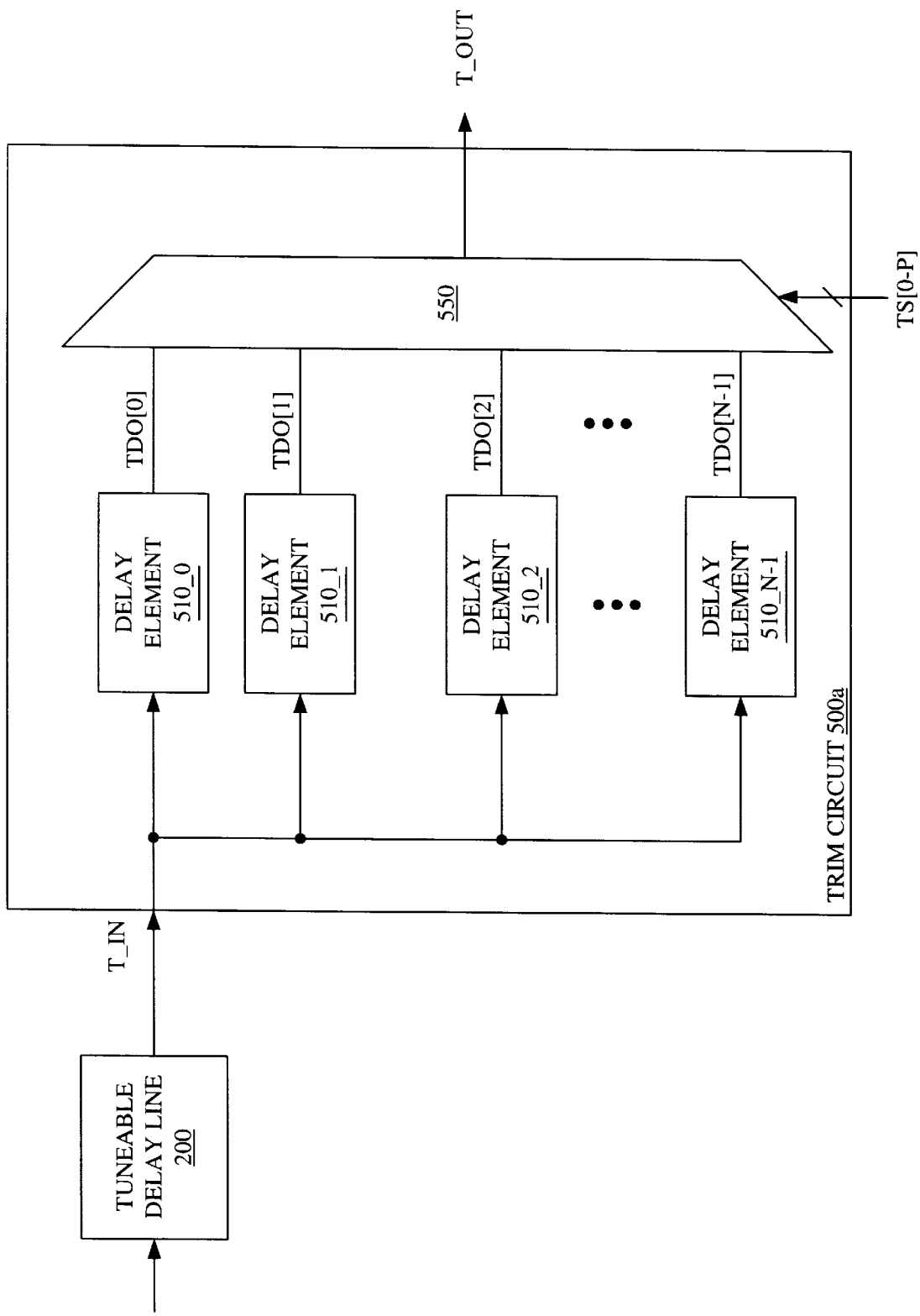
FIG. 5A is a block diagram of a trim circuit in accordance with a first embodiment of the present invention.

FIG. 5A is a block diagram of a trim circuit 500a in accordance with a first embodiment of the present invention. In contrast to conventional trim circuits, trim circuit 500a provides trim delays greater than or equal to the base delay B_D. Specifically, trim circuit 500a provides trim delay values equal to a multiple of base delay B_D plus a fraction of B_D. The fraction can be zero. In one embodiment, trim circuit 500a provides trim delay values of approximately one base delay B_D, (1+1/N) times B_D, (1+2/N) times B_D, (1+3/N) times B_D, . . . (1+(N-1)/N) times B_D. Thus, in one embodiment, trim circuit 500a comprises N delay elements (510_0 to 510_N-1) and a multiplexer 550. Each delay element 510_X receives trim input signal T_IN and generates a trim delayed output signal TDO[X] delayed from trim input signal T_IN by approximately (1+X/N) times B_D, where X is an integer from 0 to N-1, inclusive. In some embodiments of trim circuit 500a, delay element 510_0 uses the same circuitry as the delay elements of tuneable delay line 200, which is used with trim circuit 500a. Multiplexer 550 receives each of trim delayed output signals TDO[0-(N-1)] and provides one of the trim delayed output signals as trim output signal T_OUT in response to trim select signals TS[0-P]. Multiplexer 550 is designed such that the path delays for all paths through the multiplexer are equivalent. Such multiplexers are well known in the art. In one embodiment, P is equal to the smallest integer greater than or equal to log base 2 of N.

Because trim circuit 500a provides trim delays which are equal to or greater than base delay B_D, the components in delay elements 510_0 to 510_N-1 and the components in the delay elements of the tuneable delay line used in conjunction with trim circuit 500a can be of similar sizes. Thus, trim circuit 500a responds to process variations and varying environmental conditions in a manner similar to the delay elements in the delay line.

Figure 1:
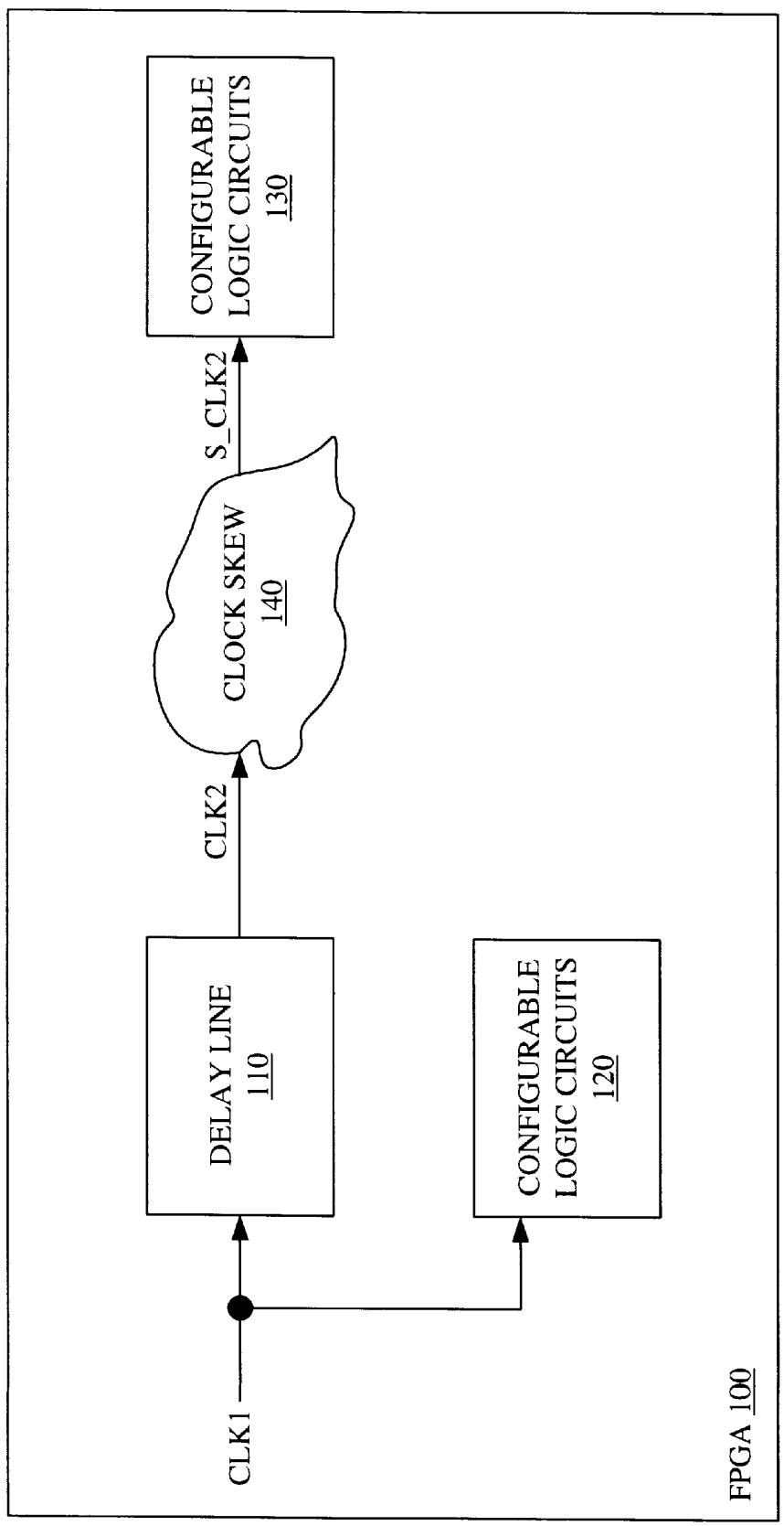
FIG. 1 is a block diagram of an FPGA using a delay line.
Figure 2:
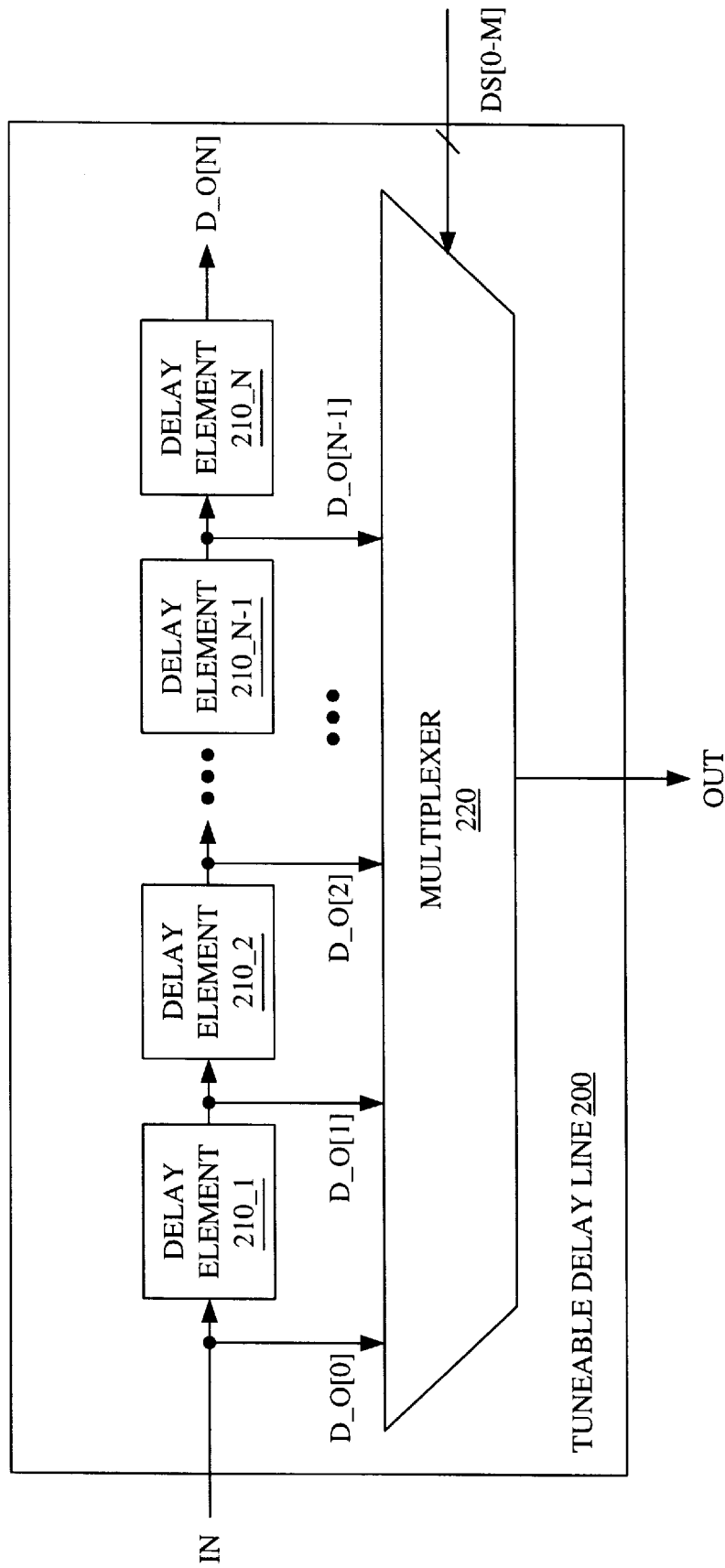
FIG. 2 is a block diagram of a conventional tuneable delay line.
Figure 3:
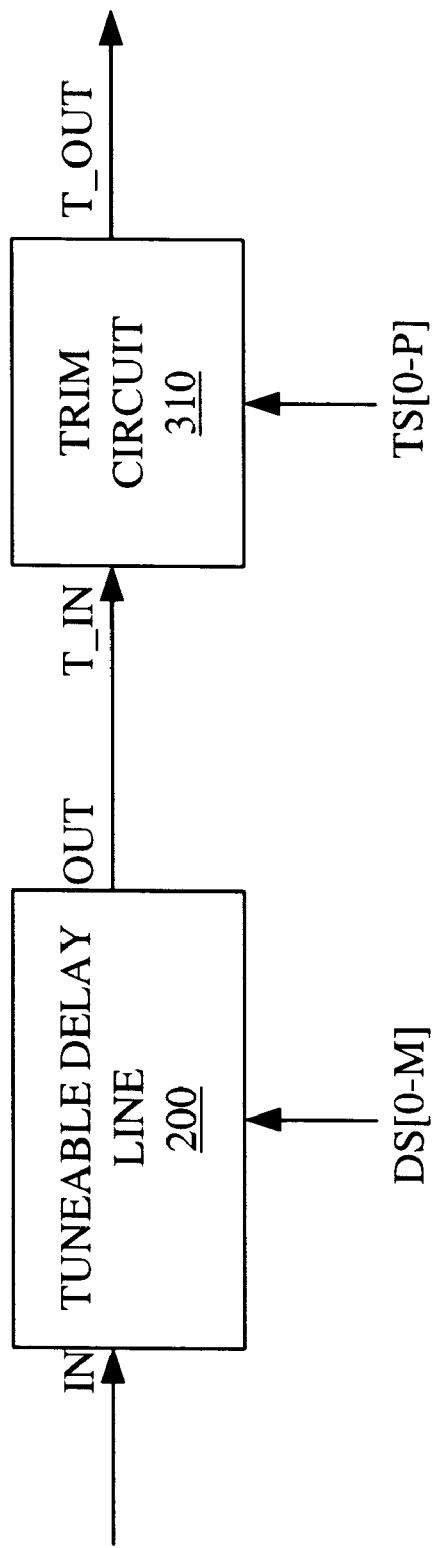
FIG. 3 is a block diagram of a tuneable delay line combined with a trim circuit.
Figure 4:
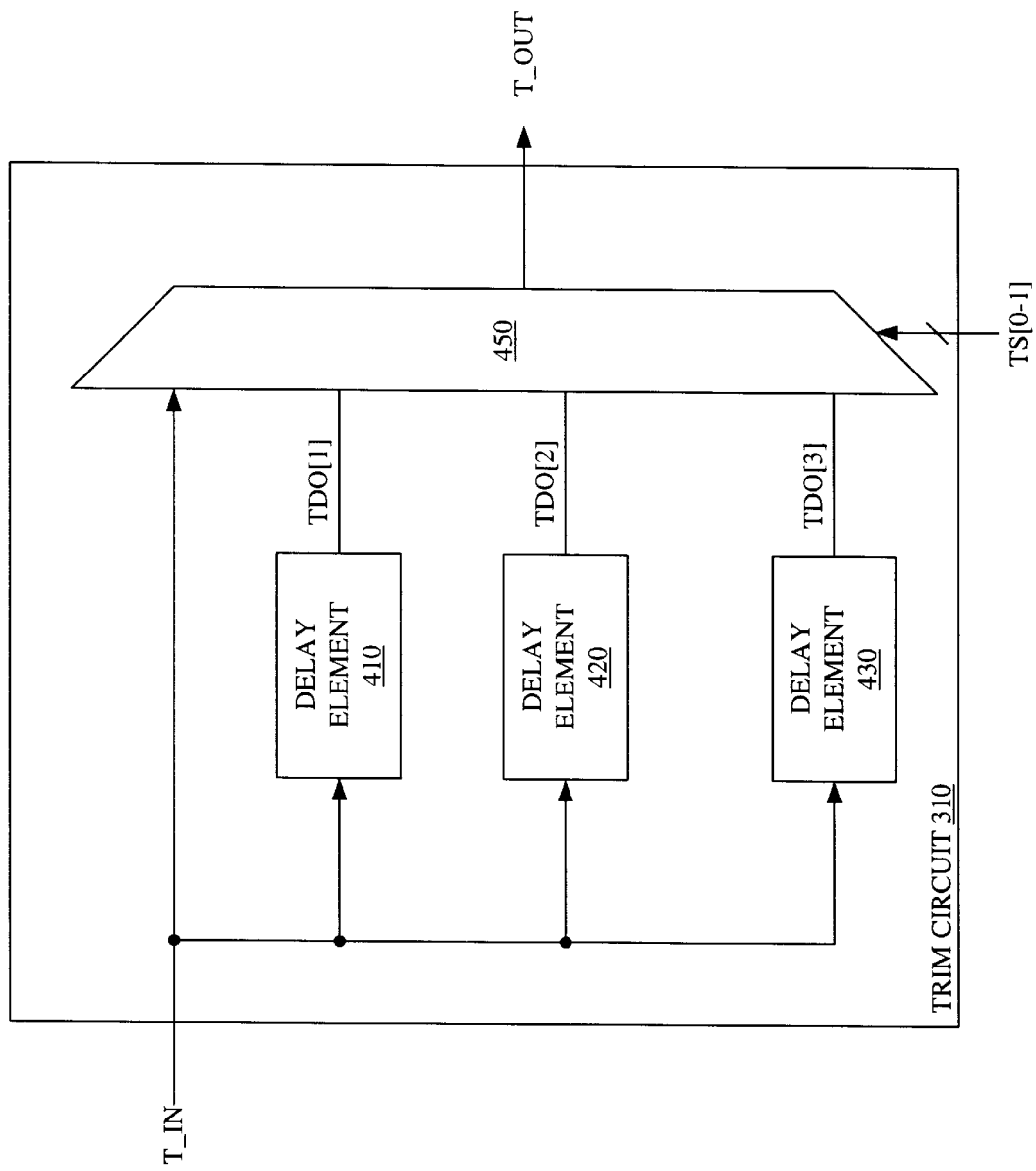
FIG. 4 is a block diagram of a conventional trim circuit.
Figure 5B:
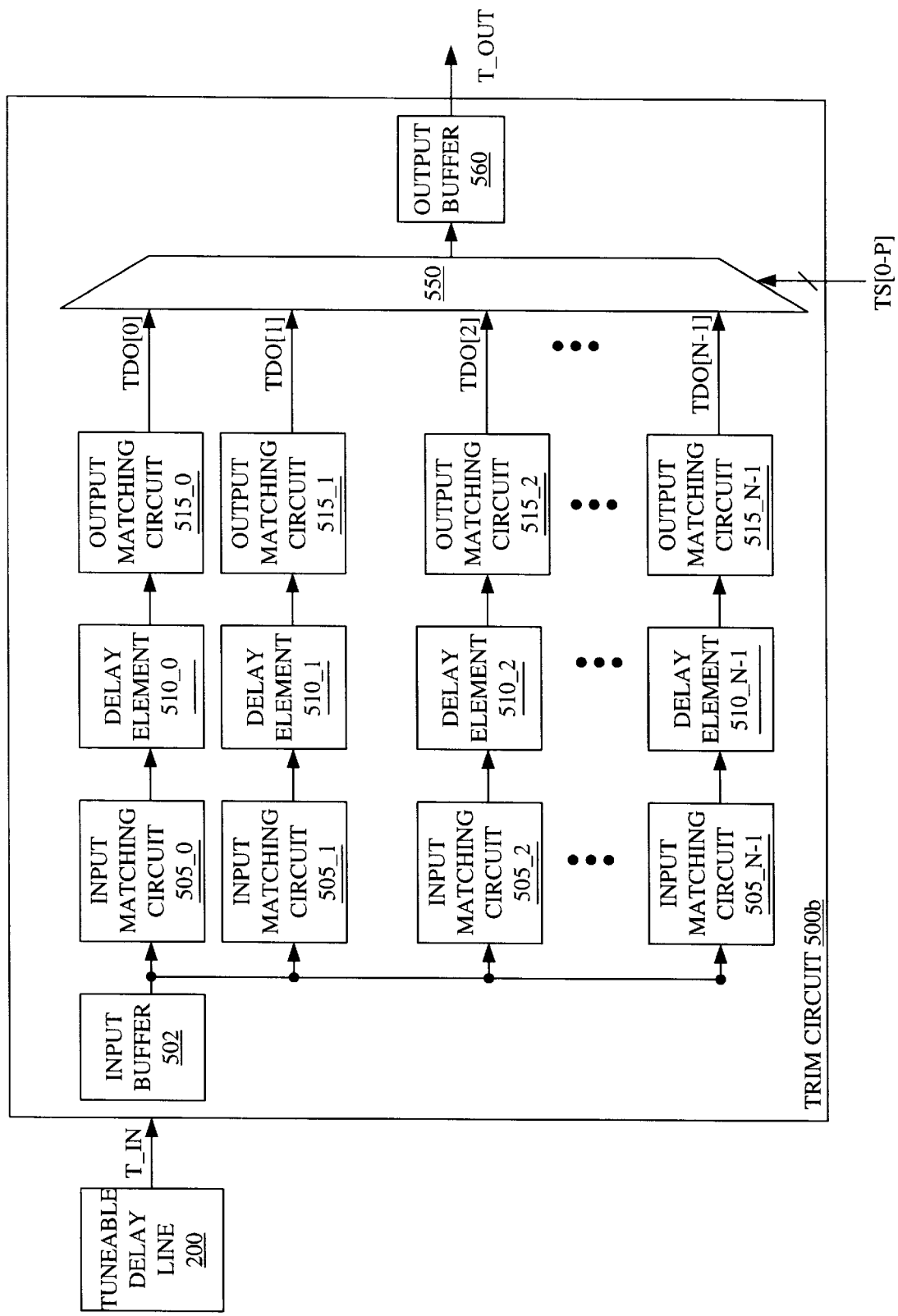
FIG. 5B is a block diagram of a trim circuit in accordance with a second embodiment of the present invention.

FIG. 5B is a block diagram of a trim circuit 500b in accordance with a second embodiment of the present invention. Trim circuit 500b uses the same delay elements as trim circuit 500a, but includes additional circuitry to emulate the load and impedance experienced by delay elements in tuneable delay line 200. Referring to FIG. 2, delay element 210_2 receives a signal from delay element 210_1. However, the signal from delay element 210_1 is also being driven to an input terminal of multiplexer 220. The load and impedance caused by multiplexer 220 may vary with environmental conditions such as temperature. Therefore, trim circuit 500b includes input matching circuits 505_0 to 505_N-1 to emulate the load and impedance at the input terminal of a delay element in tuneable delay line 200. Similarly, trim circuit 500b includes output matching circuits 515_0 to 515_N-1 to emulate the load and impedance at the output terminal of a delay element in tuneable delay line 200.

Specifically, trim circuit 500b comprises an optional input buffer 502, N input matching circuits 505_0 to 505_N-1, N delay elements 510_0 to 510_N-1, N output matching circuits 515_0 to 515_N-1, a multiplexer 550, and an optional output buffer 560. Input matching circuits 505_0 to 505_N-1 are identical in most embodiments of trim circuit 500b. Similarly, output matching circuits 515_0 to 515_N-1 are identical in most embodiments of trim circuit 500b. Input buffer 502 receives trim input signal T_IN and drives a buffered trim input signal to input matching circuits 505_0 to 505_N-1. Each delay element 510_X receives trim input signal T_IN through input buffer 502 and input matching circuit 505_X. Each delay element 510_X provides trim delayed output signal TDO[X] through output matching circuit 515_X. Trim delayed output signal TDO[X] is delayed from trim input signal T_IN by approximately a delay B+((X/N) times base delay B_D), where X is an integer from 0 to N-1, inclusive. Delay B is equal to the propagation delay of input buffer 502 plus the propagation delay of input matching circuit 505_0 plus the delay provided by delay element 510_0 plus the propagation delay of output matching circuit 515_0. In some embodiments, the components of trim circuit 500b are selected to cause delay B to be a multiple of base delay B_D.

Thus, like trim circuit 500a, trim circuit 500b provides trim delays greater than or equal to base delay B_D. Specifically, trim circuit 500b provides trim delay values equal to a delay B plus a fraction of base delay B_D, where the fraction of base delay B_D can be zero. In one embodiment, trim circuit 500b provides trim delay values of approximately delay B, B+((1/N) times B_D), B+((2/N) times B_D), B+((3/N) times B_D), . . . , B+((N−1)/N) times B_D). Specific implementations of input buffer 502, input matching circuits 505_0 to 505_N−1, output matching circuits 515_0 to 515_N−1, and output buffer 560 are described below with respect to FIG. 8.

For clarity, specific embodiments of delay elements for trim circuits 500a and 500b are described herein. Specifically, delay elements for an embodiment of trim circuit 500a with selectable trim delay values of 1, ⅓, and ⅔ times base delay B_D are described in reference to FIGS. 6A, 6B, and 6C, respectively. The delay elements of FIGS. 6A, 6B, and 6C can also be used with an embodiment of trim circuit 500b with selectable delay values of delay B, B+⅓ times B_D, and B+⅔ times B_D.

Figure 7A:
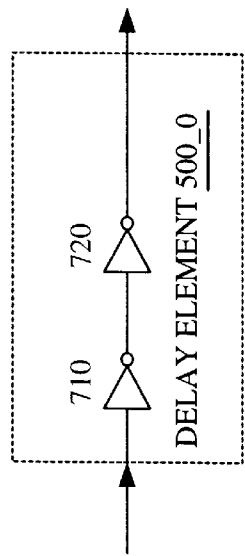
FIGS. 7A, 7B, 7C, and 7D are schematic diagrams of delay elements used in a trim circuit in accordance with one embodiment of the present invention.
Figure 7B:
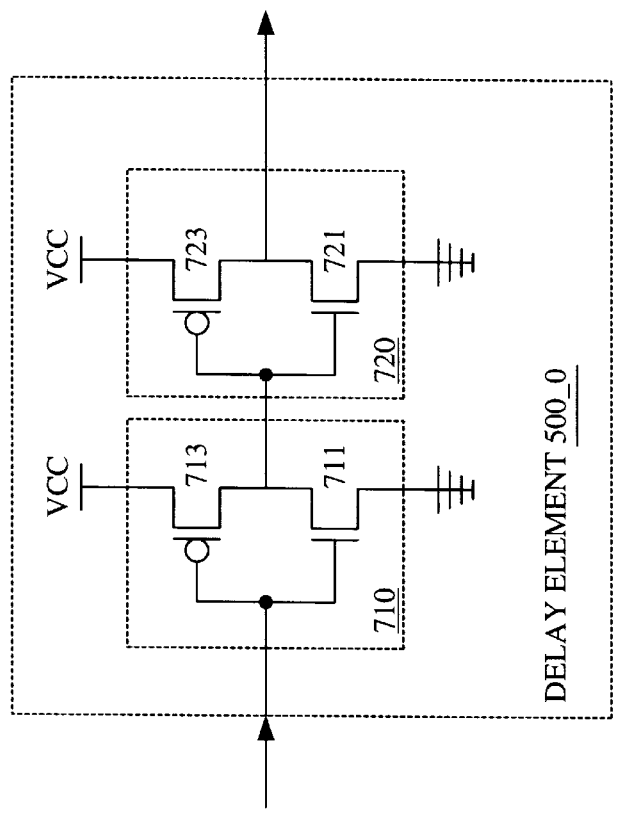
Figure 7C:
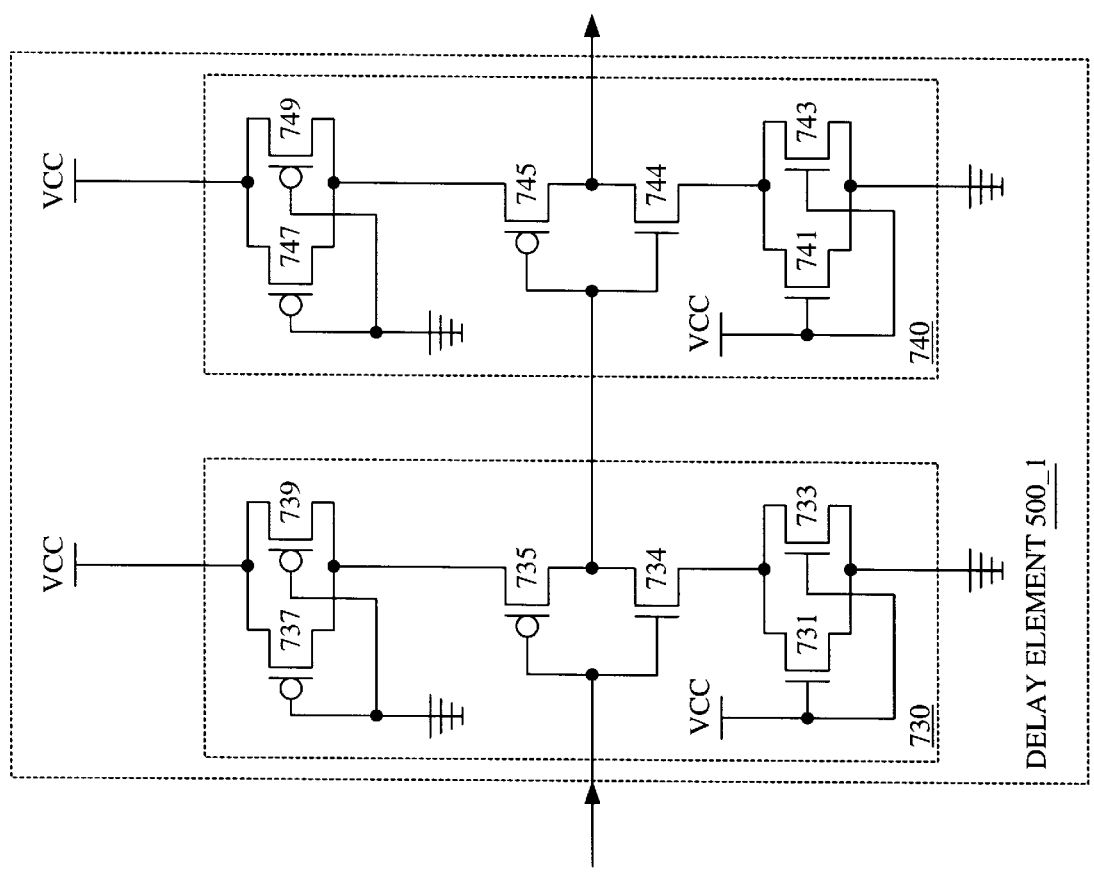
Figure 7D:
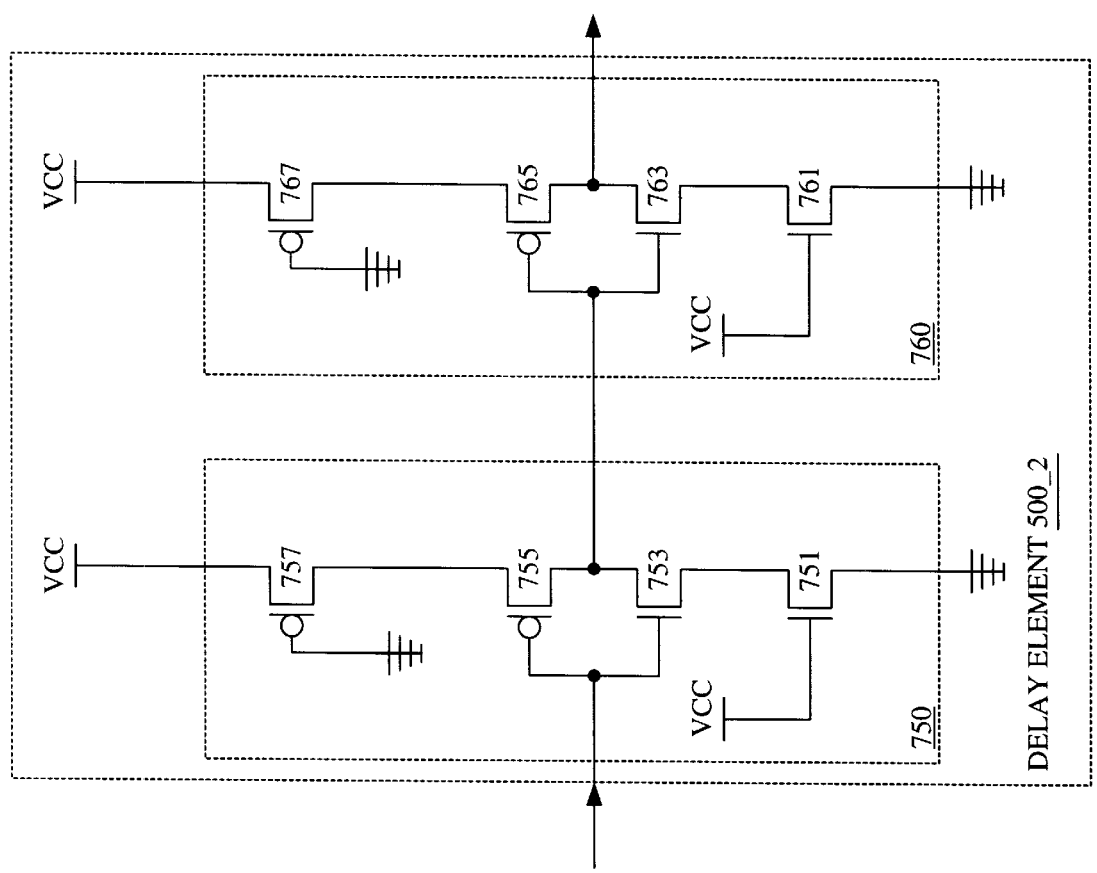

Further, delay elements for an embodiment of trim circuit 500a with selectable trim delay values of 1, ¼, ½, and ¾ times base delay B_D are described in reference to FIGS. 7B–7D. The delay elements of FIGS. 7B–D can also be used with an embodiment of trim circuit 500b with selectable delay values of delay B, B+¼ times B_D, B+½ times B_D, and B+¾ times B_D. Those skilled in the art can use the principles of the present invention described herein in other trim circuits providing other combinations of trim delays.

Figure 6B:
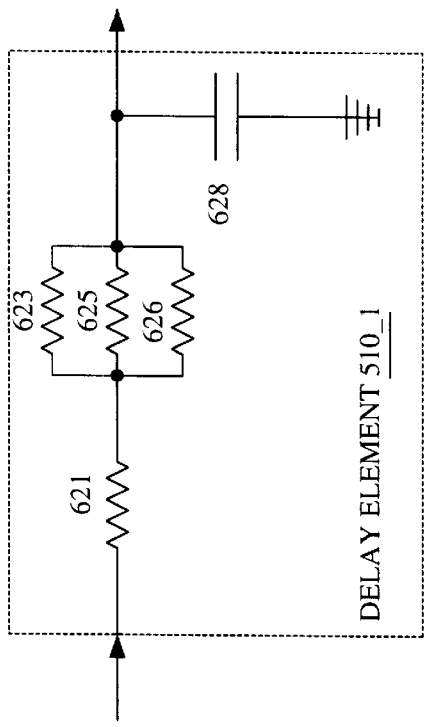
FIGS. 6A, 6B, and 6C are schematic diagrams of delay elements used in a trim circuit in accordance with one embodiment of the present invention.
Figure 6A:
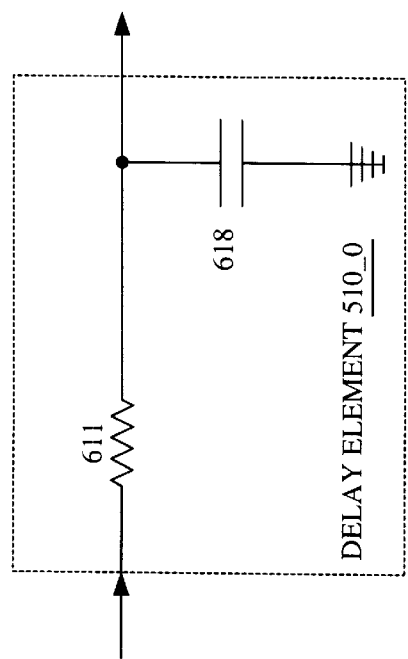
Figure 6C:
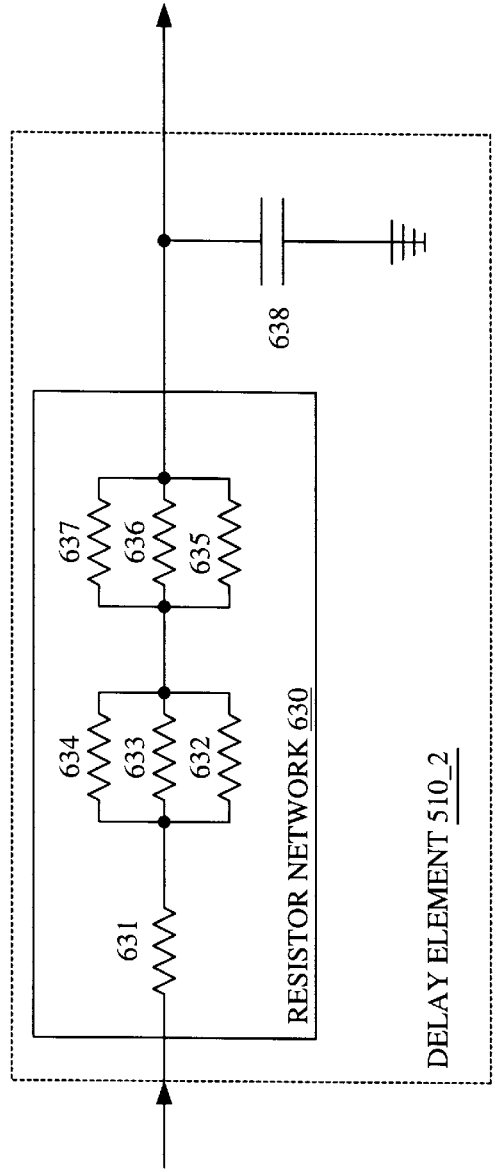

FIGS. 6A, 6B, and 6C are schematic diagrams for delay elements 510_0, 510_1, and 510_2, respectively, for an embodiment of trim circuit 500 providing trim delay values of 1, ⅓, and ⅔ times base delay B_D. The embodiment of FIGS. 6A, 6B, and 6C uses resistor-capacitor (RC) circuits for delay elements. Thus, the embodiment of FIGS. 6A, 6B, and 6C is well suited for tuneable delay lines that use RC circuits for delay elements.

In FIG. 6A, delay element 510_0 comprises a resistor 611 and a capacitor 618. Specifically, a first terminal of resistor 611 is coupled to the input terminal of delay element 510_0. A second terminal of resistor 611 is coupled to the output terminal of delay element 510_0. Capacitor 618 is coupled between the second terminal of resistor 611 and ground. If an input signal on the input terminal of delay element 510_0 switches from a logic high state to a logic low state, capacitor 618 must be discharged before the output terminal of delay element 510_0 is driven to a logic low state. The discharge time of capacitor 618 is the trim delay provided by delay element 510_0 for a signal transitioning from a logic high state to a logic low state. Conversely, when a signal on the input terminal of delay element 510_0 transitions from a logic low state to a logic high state, capacitor 618 must be charged before the output terminal of delay element 510_0 is driven to a logic high state. The charging time of capacitor 618 is the trim delay provided by delay element 510_0 for a signal transitioning from a logic low state to a logic high state.

As is well known in the art, the charging and discharging times of a capacitor in a RC circuit are directly related to the resistance of the resistor and the capacitance of the capacitor. The product of the resistance R and the capacitance C is referred to as the time constant of the RC circuit. Thus, changing the resistance of resistor 611 or the capacitance of capacitor 618 can configure the trim delay of delay element 510_0. The resistance of resistor 611 is set to base resistance R_B and the capacitance of capacitor 618 is set to base capacitance C_B so that delay element 510_0 has a trim delay equal to base delay B_D. In some embodiments of delay line 510_0 capacitor 618 is not needed, since the signal line coupled to the output terminal of delay element 510_0 has enough parasitic capacitance for delay element 510_0 to function without capacitor 618.

FIG. 6B is a schematic diagram for an embodiment of delay element 510_1. As explained above, delay line 510_1 should have a trim delay equal to (1+1/N) times the trim delay of delay element 510_0. For the embodiment of FIGS. 6A–6C, N equals three. Therefore, delay element 510_1 should have a trim delay equal to ⅓ times the trim delay of delay element 510_0. Because the delay of an RC circuit is proportional to the resistance, delay element 510_1 can be implemented using a single resistor or a resistor network having an equivalent resistance equal to ⅓ times resistance R_B with a capacitor having capacitance C_B.

As shown in FIG. 6B, delay element 510_1 can be formed using four resistors 621, 623, 625, and 626 and a capacitor 628. Capacitor 628 has capacitance C_B. Resistors 621, 623, 625, and 626 each have resistance R_B and react to process variance and varying environmental conditions in a manner similar to resistor 611. Resistors 621, 623, 625, and 626 form a resistor network with an equivalent resistance of ⅓ times resistance R_B. Thus, delay element 510_1 has a trim delay equal to ⅓ times base delay B_D. In this embodiment, a first terminal of resistor 621 is coupled to the input terminal of delay element 510_1. Resistors 623, 625, and 626 are coupled in parallel, with a first terminal of each of the resistors coupled to a second terminal of resistor 621. The second terminals of resistors 623, 625, and 626 are coupled to the output terminal of delay line 510_1. Capacitor 628 is coupled between the output terminal of delay line 510_1 and ground. In some embodiments of delay line 510_1 capacitor 628 is not needed, since the signal line coupled to the output terminal of delay element 510_1 has enough parasitic capacitance for delay element 510_1 to function without capacitor 628.

FIG. 6C is an embodiment of delay element 510_2, which provides a trim delay of ⅔ times base delay B_D. Delay element 510_2 can be formed using a single resistor or a resistor network having a resistance equal to ⅔ times resistance R_B with a capacitor having capacitance C_B. As shown in FIG. 6C, one embodiment of delay element 510_3 is formed using a capacitor 638 and resistors 631–637. Resistors 631–637 each have a resistance equal to resistance R_B and are coupled to form a resistor network 630 having an equivalent resistance of ⅔ times resistance R_B. Capacitor 638 has capacitance equal to capacitance C_B. In this embodiment, a first terminal of resistor 631 is coupled to the input terminal of delay element 510_2. Resistors 632, 633, and 634 are coupled in parallel, with the first terminals of resistors 632, 633, and 634 coupled to the second terminal of resistor 631. Resistors 635, 636, and 637 are coupled in parallel, with the first terminals of resistors 635, 636, and 637 coupled to the second terminals of resistors 632, 633, and 634. The second terminals of resistors 635, 636, and 637 are coupled to the output terminal of delay element 510_2. Capacitor 638 is coupled between the output terminal of delay element 510_2 and ground. In some embodiments of delay line 510_2 capacitor 638 is not needed, since the signal line coupled to the output terminal of delay element 510_2 has enough parasitic capacitance for delay element 510_2 to function without capacitor 638.

FIG. 7A is a schematic diagram of delay element 500_0 in another embodiment of the present invention, wherein delay element 500_0 replaces delay element 510_0, delay element 500_1 replaces delay element 510_1, and so forth. Delay element 500_0 comprises an inverter 710 coupled in series with an inverter 720. Specifically, the input terminal of inverter 710 is coupled to the input terminal of delay element 500_0, the output terminal of inverter 710 is coupled to the input terminal of inverter 720, and the output terminal of inverter 720 is coupled to the output terminal of delay element 500_0. Logically, inverters 710 and 720 cancel each other out. However, each inverter provides a propagation delay. The trim delay of delay element 500_0 is the sum of the propagation delays of inverters 710 and 720. Because delay element 500_0 of FIG. 7A is comprised of CMOS inverters 710 and 720, delay element 500_0 of FIG. 7A is particularly well suited for use with CMOS circuits.

FIG. 7B shows the transistor level schematic of delay element 500_0. Specifically, inverter 710 comprises an N-type transistor 711 and a P-type transistor 713. N-type transistor 711 has a first power terminal, a second power terminal coupled to ground, and a control terminal coupled to the input terminal of delay element 500_0. P-type transistor 713 has a first power terminal coupled to positive supply voltage VCC, a control terminal coupled to the input terminal of delay element 500_0, and a second power terminal coupled to the first power terminal of transistor 711. Inverter 720 comprises an N-type transistor 721 and a P-type transistor 723. N-type transistor 721 has a first power terminal, a second power terminal coupled to ground, and a control terminal coupled to the first power terminal of transistor 711. P-type transistor 723 has a first power terminal coupled to VCC, a control terminal coupled to the first power terminal of transistor 711, and a second power terminal coupled to the first power terminal of transistor 721.

As a first-order approximation, transistors can be modeled as resistors coupled to a capacitor, wherein the capacitor has a capacitance equal to the parasitic capacitance of the signal lines driven by the transistors. The resistance of a transistor is inversely proportional to the width-to-length (W/L) ratio of the transistor. Thus, the propagation delays of inverters 710 and 720 can be manipulated by manipulating the W/L ratio of the transistors forming the inverters. Alternatively, additional transistors can be incorporated into inverters 710 and 720 in the same manner that additional resistors were incorporated in FIGS. 6B and 6C to manipulate the resistance and delay of an RC delay element.

However, using resistors to model transistors provides only a rough approximation of the behavior of a transistor. Therefore, using well-known simulation tools such as HSPICE to derive the transistor sizes results in more accurate delay elements. FIGS. 7B, 7C, and 7D are schematic diagrams of delay elements in accordance with one embodiment of the present invention. Delay element 500_0 of FIG. 7B provides a trim delay equal to one base delay B_D. The embodiments of delay elements 500_1, 500_2, 500_3 described in conjunction with FIGS. 7C and 7D provide trim delays approximately equal to ⅝ times B_D, ½ times B_D, and ⅞ times B_D, as described in detail below. The transistor sizes given below are for a specific embodiment of a trim circuit in accordance with the present invention. Those skilled in the art can apply the principles described herein to create trim circuits using other transistor sizes and circuit networks in accordance with the present invention.

The length (L) of each transistor in FIG. 7B is 0.25 microns. The width (W) in microns of the transistors in FIG. 7B are summarized in TABLE 1.

TABLE 1

| TRANSISTOR | WIDTH |
| --- | --- |
| 711 | 2.0 |
| 713 | 2.0 |
| 721 | 2.0 |
| 723 | 2.3 |

The embodiment of delay element 500_1 in FIG. 7C provides a trim delay of ⅝ times base delay B_D. Specifically, delay element 500_1 in FIG. 7C comprises an inverter 730 and an inverter 740 coupled in series between the input terminal of delay element 500_1 and the output terminal of delay element 500_1. Inverter 730 has a propagation delay approximately equal to ⅝ times the propagation delay of inverter 710 of FIG. 7B. Similarly, inverter 740 has a propagation delay approximately equal to ⅝ times the propagation delay of inverter 720. Thus, delay element 500_1 has a propagation delay approximately equal to ⅝ times base delay B_D.

Inverter 730 comprises N-type transistors 731, 733, 734, and P-type transistors 735, 737, 739. Transistors 731 and 733 are coupled in parallel. Each of transistors 731 and 733 has a first power terminal, a second power terminal coupled to ground, and a control terminal coupled to positive supply voltage VCC, causing transistors 731 and 733 to be in a conducting state. Transistor 734 has a first power terminal, a second power terminal coupled to the first power terminals of transistors 731 and 733, and a control terminal coupled to the input terminal of delay element 500_1. Transistor 735 has a first power terminal, a second power terminal coupled to the first power terminal of transistor 734, and a control terminal coupled to the input terminal of delay element 500_1. Transistors 737 and 739 are coupled in parallel. Each of transistors 737 and 739 has a first power terminal coupled to VCC, a second power terminal coupled to the first power terminal of transistor 735, and a control terminal coupled to ground, thereby causing both of transistors 737 and 739 to be in the conducting state. Transistors 737 and 739 increase the resistance between the second power terminal of transistor 735 and VCC. Similarly, transistors 731 and 733 increase the resistance between the first power terminal of transistor 734 and ground. Thus, the presence of transistors 737, 739, 731, and 733 causes the propagation time of inverter 730 to be greater than the propagation time of inverter 710 of FIG. 7B. Simulation data shows that for transistors having a length (L) of 0.25 microns and the widths (W) given in TABLE 2, inverter 730 has a propagation delay approximately equal to ⅝ times the propagation delay of inverter 710.

Inverter 740 comprises N-type transistors 741, 743, 744 and P-type transistors 745, 747, 749. Because the circuit connections of the transistors in inverter 740 are identical to the circuit connections in inverter 730 the circuit description of inverter 740 is not repeated. P-type transistors 747 and 749 increase the resistance between the second power terminal of P-type transistor 745 and VCC. Similarly, N-type transistors 741 and 743 increase the resistance between the first power terminal of transistor 744 and ground. Thus, the presence of transistors 747, 749, 741, and 743 causes the propagation time of inverter 740 to be greater than the propagation time of inverter 720. Simulation data shows that for transistors having a length (L) of 0.25 microns and the widths (W) given in TABLE 2, inverter 740 has a propagation delay approximately equal to 5/4 times the propagation delay of inverter 720.

TABLE 2

| TRANSISTOR | WIDTH |
|---|---|
| 731 | 2.85 |
| 733 | 2.85 |
| 734 | 2.1 |
| 735 | 2.0 |
| 737 | 2.85 |
| 739 | 2.85 |
| 741 | 2.85 |
| 743 | 2.85 |
| 744 | 2.0 |
| 745 | 2.3 |
| 747 | 3.65 |
| 749 | 3.65 |

FIG. 7D shows an embodiment of delay element 500_2 providing a trim delay of 3/2 times base delay B_D. Specifically, delay element 500_2 in FIG. 7D comprises an inverter 750 and an inverter 760 coupled in series between the input terminal of delay element 500_2 and the output terminal of delay element 500_2. Inverter 750 has a propagation delay approximately equal to 3/2 times the propagation delay of inverter 710 of FIG. 7B. Similarly, inverter 760 has a propagation delay approximately equal to 3/2 times the propagation delay of inverter 720. Thus, delay element 500_2 has a propagation delay approximately equal to 3/2 times base delay B_D.

Inverter 750 comprises N-type transistors 751, 753 and P-type transistors 755, 757. Transistor 751 has a first power terminal, a second power terminal coupled to ground, and a control terminal coupled to positive supply voltage VCC, causing transistor 751 to be in a conducting state. Transistor 753 has a first power terminal, a second power terminal coupled to the first power terminal of transistor 751, and a control terminal coupled to the input terminal of delay element 500_2. Transistor 755 has a first power terminal, a second power terminal coupled to the first power terminal of transistor 753, and a control terminal coupled to the input terminal of delay element 500_2. Transistor 757 has a first power terminal coupled to VCC, a second power terminal coupled to the first power terminal of transistor 755, and a control terminal coupled to ground, thereby causing transistor 757 to be in the conducting state. Transistor 757 increases the resistance between the second power terminal of transistor 755 and VCC. Similarly, transistor 751 increases the resistance between the first power terminal of transistor 753 and ground. Thus, the presence of transistors 757 and 751 causes the propagation time of inverter 750 to be greater than the propagation time of inverter 710 of FIG. 7B. Simulation data shows that for transistors having a length (L) of 0.25 microns and the widths (W) given in TABLE 3, inverter 750 has a propagation delay approximately equal to 5/4 times the propagation delay of inverter 710.

Inverter 760 comprises N-type transistors 761, 763 and P-type transistors 765, 767. Because the circuit connections of the transistors in inverter 760 are identical to the circuit connections in inverter 750, the circuit description of inverter 760 is not repeated. P-type transistor 767 increases the resistance between the second power terminal of P-type transistor 765 and the positive supply voltage VCC. Similarly, N-type transistor 761 increases the resistance between the first power terminal of transistor 763 and ground. Thus, the presence of transistors 767 and 761 causes the propagation time of inverter 760 to be greater than the propagation time of inverter 720. Simulation data shows that for transistors having a length (L) of 0.25 microns and the widths (W) given in TABLE 3, inverter 760 has a propagation delay approximately equal to 3/2 times the propagation delay of inverter 720.

TABLE 3

(for Delay Element 500_2)

| TRANSISTOR | WIDTH |
|---|---|
| 751 | 3.0 |
| 753 | 2.1 |
| 755 | 2.0 |
| 757 | 3.0 |
| 761 | 3.0 |
| 763 | 2.0 |
| 765 | 2.3 |
| 767 | 3.75 |

The circuit of FIG. 7D can also be used to describe an embodiment of delay element 500_3 providing a trim delay of 7/4 times base delay B_D. Simulation data shows that the circuit of FIG. 7D provides a propagation delay approximately equal to 7/4 times the propagation delay of inverter 720 when the transistor widths shown in TABLE 4 are used.

TABLE 4

(for Delay Element 500_3)

| TRANSISTOR | WIDTH |
|---|---|
| 751 | 2.3 |
| 753 | 2.1 |
| 755 | 2.0 |
| 757 | 2.1 |
| 761 | 2.1 |
| 763 | 2.0 |
| 765 | 2.3 |
| 767 | 2.65 |

Figure 8:
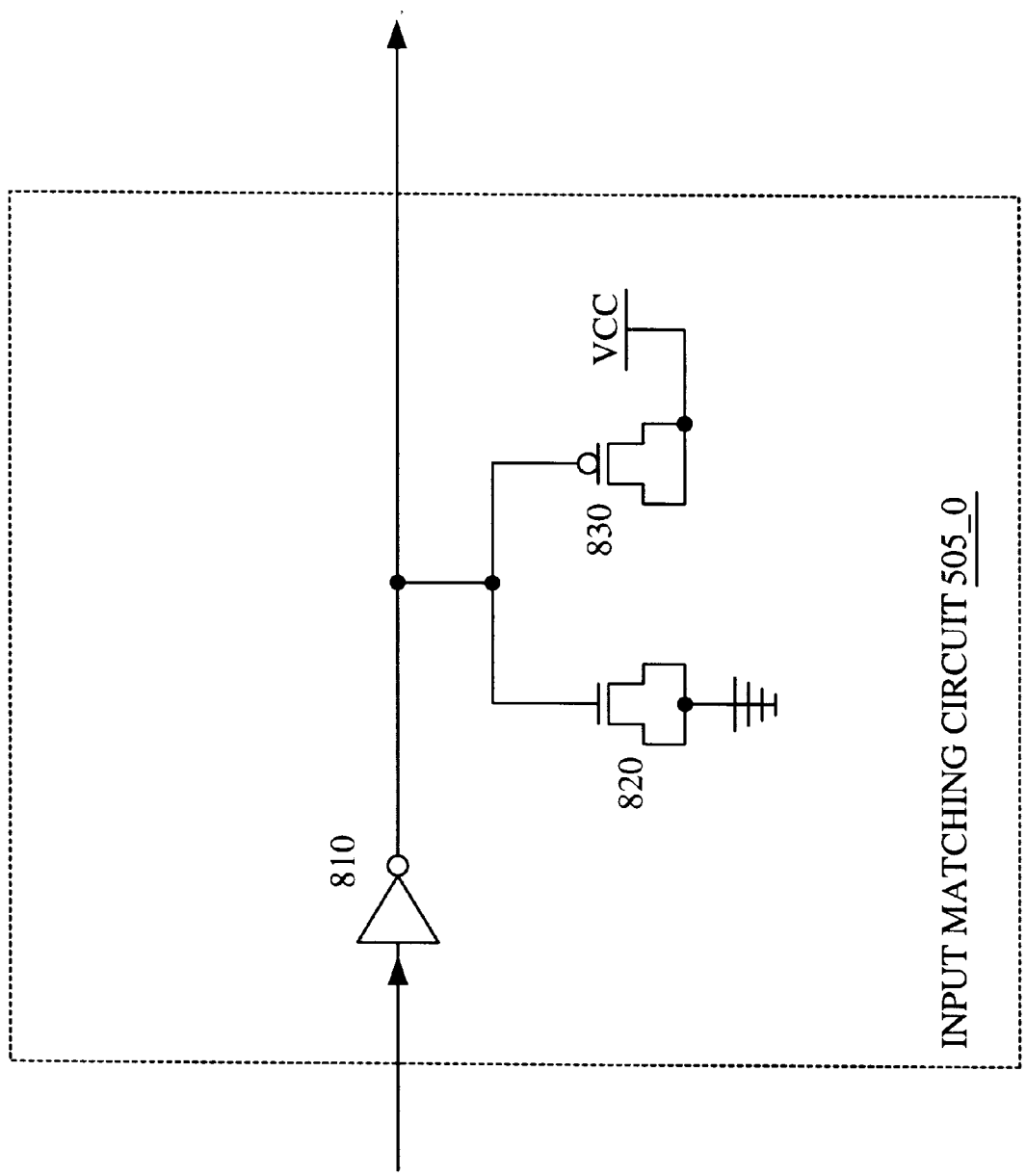
FIG. 8 is a block diagram of an input matching circuit in accordance with one embodiment of the present invention.

FIG. 8 is a block diagram of an embodiment of input matching circuit 505_0 of FIG. 5B suited for the delay elements of FIGS. 7A–7D. The embodiment of FIG. 8 comprises an inverter 810, an N-type transistor 820, and a P-type transistor 830. Inverter 810 receives the buffered trim input signal from input buffer 502 (FIG. 5B) and drives the output singnal of input matching circuit 505_0. The output terminal of inverter 810 is also coupled to the gate terminals of transistors 820 and 830. The power terminals of transistor 820 are both coupled to ground. The power terminals of transistor 830 are both coupled to the positive supply voltage VCC. Transistors 820 and 830 emulate the load and impedance caused by an input terminal of multiplexer 220 in tuneable delay line 200 (FIG. 2). Thus, by using input matching circuit 505_X, the operating environment of delay element 510_X of trim circuit 500*b* (FIG. 5B) better approximates the operating environment of a delay element of tuneable delay line 200. The length (L) of the transistors used in input matching circuit 505_0 (including an N-type transistor and a P-type transistor in inverter 810 that are not shown in FIG. 8) is 0.25 microns. The width (W) of the transistors in FIG. 8 are summarized in TABLE 5.

TABLE 5

| TRANSISTOR | WIDTH |
| --- | --- |
| N-type in 810 | 2.0 |
| P-type in 810 | 2.3 |
| 820 | 1.0 |
| 830 | 2.5 |

For the delay elements of FIGS. 7A–7D, input buffer 502 (FIG. 5B), output matching circuit 515_X, and output buffer 560 can each be a single inverter. The length (L) of each transistor used in these inverters is 0.25 microns. The width (W) of these transistors are summarized in TABLE 6.

TABLE 6

| TRANSISTOR | WIDTH |
| --- | --- |
| N-type in 502 | 7.2 |
| P-type in 502 | 8.8 |
| N-type in 515_X | 2.7 |
| P-type in 515_X | 4.8 |
| N-type in 560 | 3.4 |
| P-type in 560 | 7.7 |

Other embodiments of trim circuit 500b can use other embodiments of input buffer 502, input matching circuit 505_X, output matching circuit 515_X, and output buffer 560.

In the various embodiments of this invention, novel structures have been described for precision trim circuits. By forming a trim circuit that provides trim delays equal to or greater than the base delay of a delay line, the present invention avoids the problems caused by process variations and varying environmental conditions on small, fast circuits. The various embodiments of the structures and methods of this invention that are described above are illustrative only of the principles of this invention and are not intended to limit the scope of the invention to the particular embodiments described. For example, in view of this disclosure, those skilled in the art can define other delay elements, multiplexers, RC circuits, inverters, transistors sizes, delay lines, trim circuits, input buffers, output buffers, input matching circuits, output matching circuits and so forth, and use these alternative features to create a method, circuit, or system according to the principles of this invention. Thus, the invention is limited only by the following claims.

What is claimed is:

1. A delay circuit comprising:

a delay line having a base delay; and a trim circuit coupled to the delay line and having a first delay element having a first delay at least equal to the base delay of the delay line;

a second delay element having a second delay greater than the first delay;

a multiplexer coupled to the first delay element and the second delay element;

a third delay element coupled to the multiplexer, the third delay element having a third delay greater than the second delay; and a fourth delay element coupled to the multiplexer, the fourth delay element having a fourth delay greater than the third delay.

2. The trim circuit of claim 1, wherein:

the first delay element comprises a first inverter and a second inverter together having said first delay; and the second delay element comprises a third inverter and a fourth inverter together having said second delay greater than the first delay.

3. A trim circuit for a delay line having a base delay, the trim circuit comprising:

a first delay element having a first delay at least equal to the base delay;

a second delay element having a second delay greater than the first delay;

a multiplexer coupled to the first delay element and the second delay element;

a first input matching circuit coupled to the first delay element; and a second input matching circuit coupled to the second delay element.

4. The trim circuit of claim 3, wherein the first input matching circuit comprises:

an inverter having an output terminal coupled to the first delay element;

a first transistor having a gate terminal coupled to the output terminal of the inverter, a first power terminal coupled to ground, and a second power terminal coupled to ground; and a second transistor having a gate terminal coupled to the output terminal of the inverter, a first power terminal coupled to a positive supply voltage, and a second power terminal coupled to the positive supply voltage.

5. The trim circuit of claim 3, wherein the first and second input matching circuits emulate a load and impedance of the delay line.

6. The trim circuit of claim 3, wherein the second delay is approximately 1.5 times the first delay.

7. The trim circuit of claim 3, wherein:

the first delay element comprises a first inverter and a second inverter together having said first delay; and the second delay element comprises a third inverter and a fourth inverter together having said second delay greater than the first delay.

8. The trim circuit of claim 3, further comprising:

a third delay element coupled to the multiplexer, the third delay element having a third delay greater than the second delay; and a fourth delay element coupled to the multiplexer, the fourth delay element having a fourth delay greater than the third delay.

9. A trim circuit for a delay line having a base delay, the trim circuit comprising:

a first delay element having a first delay at least equal to the base delay;

a second delay element having a second delay greater than the first delay;

a multiplexer coupled to the first delay element and the second delay element;

a first output matching circuit coupled between the first delay element and the multiplexer; and a second output matching circuit coupled between the second delay element and the multiplexer.

10. The trim circuit of claim 9, wherein the second delay is approximately 1.5 times the first delay.

11. The trim circuit of claim 9, wherein:
the first delay element comprises a first inverter and a second inverter together having said first delay; and
the second delay element comprises a third inverter and a fourth inverter together having said second delay greater than the first delay.

12. The trim circuit of claim 9, further comprising:
a third delay element coupled to the multiplexer, the third delay element having a third delay greater than the second delay; and
a fourth delay element coupled to the multiplexer, the fourth delay element having a fourth delay greater than the third delay.

13. A trim circuit for a delay line having a base delay, the trim circuit comprising:

a first delay element having a first delay at least equal to the base delay;
a second delay element having a second delay approximately equal to 1.25 times the first delay;
a multiplexer coupled to the first delay element and the second delay element;
a third delay element coupled to the multiplexer, the third delay element having a third delay approximately equal to 1.5 times the first delay; and
a fourth delay element coupled to the multiplexer, the fourth delay element having a fourth delay approximately equal to 1.75 times the first delay.

* * * * *